United States Patent
Brown et al.

[11] Patent Number: 6,142,650
[45] Date of Patent: Nov. 7, 2000

[54] LASER FLASHLIGHT

[76] Inventors: David C. Brown, R.R. #1, Box 366, Brackney, Pa. 13812; Richard J. Nelson, 383 Spring St., Manchester, Conn. 06040; Titus A. Casazza, 165 Grandview Dr., Glastonbury, Conn. 06033; Jay Kohoe, 12 Glazier Dr., Glastonbury, Conn. 06073

[21] Appl. No.: 09/111,335

[22] Filed: Jul. 7, 1998

Related U.S. Application Data

[60] Provisional application No. 60/052,159, Jul. 10, 1997.

[51] Int. Cl.[7] .......................... F21K 27/00; G03B 29/00; H01S 3/10
[52] U.S. Cl. ............................... 362/259; 353/43; 372/22
[58] Field of Search ................................ 362/259, 109, 362/116, 118; 353/42, 43; 372/22

[56] References Cited

U.S. PATENT DOCUMENTS

| | | | |
|---|---|---|---|
| 4,186,851 | 2/1980 | Cantor | 222/113 |
| 4,842,277 | 6/1989 | LaCroix | 273/84 |
| 4,843,336 | 6/1989 | Kuo | 340/521 |
| 5,052,801 | 10/1991 | Downes, Jr. et al. | 356/153 |
| 5,072,342 | 12/1991 | Minovitch | 362/111 |
| 5,222,798 | 6/1993 | Adams | 362/110 |
| 5,237,773 | 8/1993 | Claridge | 42/103 |
| 5,243,894 | 9/1993 | Minovitch | 89/1.11 |
| 5,343,376 | 8/1994 | Huang | 362/259 |
| 5,364,097 | 11/1994 | Lyon | 273/84 |
| 5,381,430 | 1/1995 | Nozaki et al. | 372/21 |
| 5,396,069 | 3/1995 | Craig et al. | 250/330 |
| 5,685,636 | 11/1997 | German | 362/259 |

*Primary Examiner*—Cassandra Spyrou
*Assistant Examiner*—Jared Treas
*Attorney, Agent, or Firm*—Alix, Yale & Ristas, LLP

[57] ABSTRACT

A laser flashlight employs a laser emitter disposed within a housing for emitting a coherent light along an optical axis toward the light emitting end of the housing. A power supply selectively applies electricity from a battery pack disposed within the housing to the laser emitter. An optical system disposed within the housing intermediate the laser emitter and the light emitting end of the housing includes a laser element pumped by the laser emitter, a frequency/wavelength converter, and a resonator, to form the coherent light into a laser beam. A beam expander receives the laser beam, disperses the laser beam, and transmits the dispersed laser beam from the light emitting end of the housing into the ambient environment. The dispersion of the laser beam is such that the laser beam is safe for the human eye at the light emitting end of the housing.

33 Claims, 6 Drawing Sheets

LASER FLASHLIGHT

CROSS-REFERENCE TO RELATED APPLICATION

This application claims the priority of U.S. Provisional Patent Application No. 60/052,159 filed on Jul. 10, 1997.

BACKGROUND OF THE INVENTION

The present invention generally relates to the field of portable illumination devices for illuminating an ambient environment. More specifically, the present invention is directed to a hand-held laser flashlight which illuminates an ambient environment while minimizing the risk of causing irreversible eye damage.

Law enforcement, corrections, and military personnel face increasingly greater threats in their daily activities. Routine traffic stops can end in officers finding themselves in life-threatening situations. Domestic disputes and drug enforcement activities are amongst the most dangerous law enforcement personnel face. Also, increasingly law enforcement personnel face situations such as riots or unruly groups of individuals where certain lethal options cannot be used or would only serve to further exacerbate the situation. The availability of non-lethal weapons expands the range of options available to law enforcement in reacting to potentially violent or life-threatening situations.

Hand-held flashlights have been in widespread usage in many areas for many years. For example, in the area of forensics, law enforcement personnel have found flashlights to be so useful that incandescent flashlights have become "standard issue." These "standard issue" flashlights produce a bright beam from a small and relatively light-weight package. Such "standard issue" flashlights have, inter alia, been used by law enforcement personnel to illuminate crime scenes, to disorient and confuse suspects and to physically subdue suspects.

The effect of laser light on human eyesight can be separated into three categories: glare effects, dazzling or flashblinding, and permanent damage. The retinal damage threshold in general depends upon the laser wavelength, the exposure duration, and whether or not the laser is operated in continuous wave or pulsed or modulated mode and, if pulsed, the repetition rate and the pulse duration. If the laser light intensity is such that the damage threshold for the eye is exceeded, lesions are produced that are permanent. This damage occurs at the location of the retina for visible and near-infrared light. Ultraviolet and far-infrared light on the other hand are absorbed in the cornea and the light never reaches the retina.

The exact intensities where glare stops and dazzling occurs are difficult to define with precision and depend to a large extent on the individual involved. In general, however, glare occurs first and results in little or no loss of vision performance. In fact, after a laser source is turned off, in the glare region no after-effects or latent images occur. If the intensity is increased, however, at some intensity or over a range of intensities, dazzling occurs. If the laser is turned off, short-term partial loss of vision occurs, typically lasting for seconds or tens of seconds. At still greater intensities the after-effect is substantially longer, perhaps as long as minutes. This effect is best compared to the use of a fundus camera to photograph the retina of the human eye, usually under fully dilated conditions. Substantial vision loss can occur and last for many minutes.

Some inroads have also been made in applying laser technology to portable illumination devices in limited areas. One major drawback of such uses of lasers has been that the laser beam emitted by such low-power devices has the potential to produce irreversible eye damage if a person gazes directly into the light source. Thus, these devices are not "eyesafe." Naturally, this problem becomes exacerbated as attempts are made to increase the output power of such devices. Another significant limitation associated with such portable laser emitting devices is that they have, to date, been unable to produce nearly as much light as comparably sized incandescent flashlights. Accordingly, their lack of versatility and overall poor performance has limited their use.

SUMMARY OF THE INVENTION

Briefly stated, the invention in a preferred form is a laser flashlight employing a laser emitter disposed within a housing for emitting a coherent light along an optical axis toward the light emitting end of the housing. A power supply selectively supplies electricity from at least one battery disposed within the housing to the laser emitter. An optical system is also disposed within the housing, along the optical axis, intermediate the laser emitter and the light emitting end of the housing. The optical system forms a laser beam from the coherent light emitted by the laser emitter and transmits the laser beam along the optical axis to a light transmissive beam expander disposed at the light emitting end of the housing. A first end surface of the beam expander receives the laser beam. The beam expander disperses the laser beam and transmits the dispersed laser beam from a second end surface into the ambient environment. The dispersion of the laser beam is such that the laser beam is safe for the human eye at the second end surface of the beam expander or the flashlight aperture.

In different embodiments of the laser flashlight of the present invention, the laser emitter and the optical path configuration can be either at least one diode laser optically connected to an optical fiber which is optically connected to the beam expander or, alternatively, at least one diode-pumped laser optically connected to a resonator which is optically connected to the beam expander. Thus, the emitter can be directly coupled to the beam expander via an optical fiber or coupled therewith using a resonator. Further, the laser beam emitted by the flashlight may be either continuous wave or pulsed.

The optical system of the flashlight may include a harmonic generating crystal to shift the frequency and wavelength of the laser beam. In such a laser flashlight, the optical system also includes either a harmonic mirror element or optical coatings to reverse the direction of the harmonic light which is traveling back toward the laser emitter to increase the efficiency of the flashlight. The optical system may also include one or more lenses to focus the coherent light emitted by the laser emitter on a laser crystal.

It is, accordingly, an object of the present invention to provide an eyesafe laser flashlight which will not produce irreversible eye damage if a person gazes directly into the flashlight.

It is a further object of the present invention to provide a portable laser flashlight having the general size, shape and weight characteristics of a "standard issue" incandescent flashlight used by law enforcement personnel.

It is still another object of the present invention to provide a hand-held laser flashlight which is capable of emitting significantly more light than prior hand-held laser-based illumination devices to thereby enable the laser flashlight to be effectively used over longer distances and/or to illuminate larger areas.

It is yet another object of the present invention to provide a portable laser flashlight having at least one laser emitter that can be modulated in either periodic or random fashion to more efficiently produce a bright beam of light.

It is an additional object of the present invention to provide an eyesafe portable laser flashlight which employs at least one laser emitter and is capable of operating at more than one output wavelength.

It is a further object of the present invention to provide a portable laser flashlight which employs a plurality of laser emitters at least some of which can be operated in a modulated mode to produce a varying output.

It is still another object of the present invention to provide a hand-held laser flashlight which provides an optimal combination of (a) simplicity; (b) reliability; (c) durability; (d) versatility; and (e) efficiency.

Numerous other advantages and features of the present invention will become apparent to those of ordinary skill in the art from the following detailed description of the invention, from the claims and from the accompanying drawings.

BRIEF DESCRIPTION OF THE DRAWINGS

The preferred embodiments of the present invention will be described below with reference to the accompanying Figures wherein like numerals represent like structures and wherein.

DESCRIPTION OF THE PREFERRED EMBODIMENT

Figure 1:
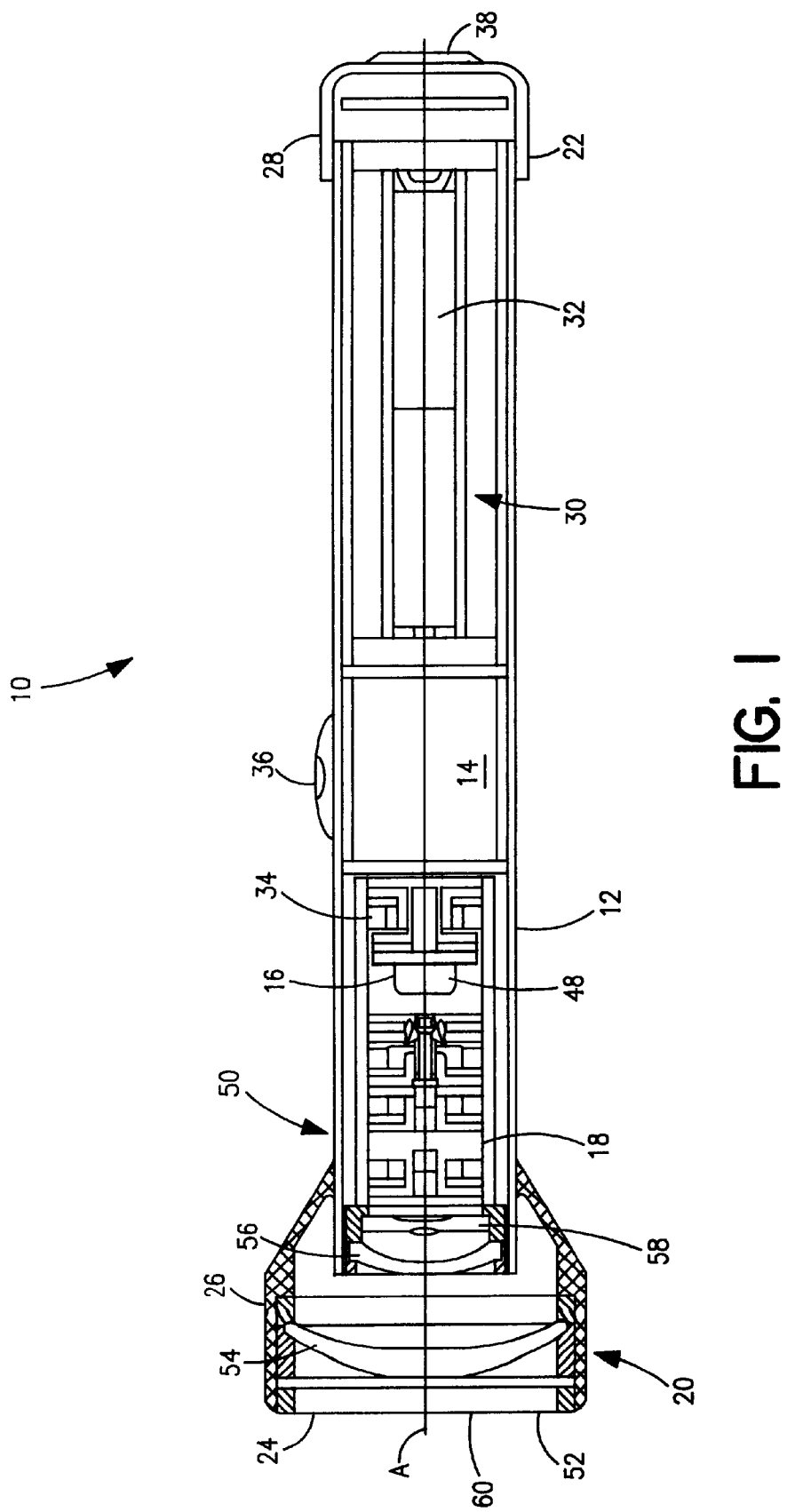
FIG. 1 is a cross-sectional side elevation view of a first preferred embodiment of the laser flashlight of the present invention.

A laser flashlight 10 in accordance with a first preferred embodiment of the present invention will be described below with reference to FIG. 1. As shown therein, laser flashlight 10 generally includes a housing 12, a power supply 14, a diode source, or package 16, a resonator 18 and a beam expander 20. As shown, these components are preferably axially aligned along an axis A which is defined by the direction of travel of laser beams emitted from diode package 16. Housing 12 comprises a generally cylindrical main body coaxially disposed about axis A, a first end 22, a second light emitting end or aperture 24, a lens-retaining shell 26 disposed at the second end 24 and an end cap 28 disposed at the first end 22.

A battery pack 30 having a plurality of batteries 32 is disposed within the housing 12 to supply electricity to a variety of components. In particular, battery pack 30 preferably includes six 1.2 volt 3 amp nickel metal hydride rechargeable batteries 32 commercially available from Duracell Corporation in size 4/3A with Model No. DH43289. Two of the six batteries 32 are connected in series to drive diode package 16. The remaining four batteries 32 are connected to supply electricity to the electronics associated with the power supply 14 as well as to the thermoelectric cooling (TEC) unit 34 used to cool the diode package 16. Battery pack 30 should yield approximately two hours of operating time depending on the particular diode package 16 and TEC unit 34 employed.

Electricity is applied to the diode package 16 and the TEC unit 34 from battery pack 30 via the power supply 14. Power supply 14 preferably includes electrical conductors as known in the art and an on/off switch 36 for selectively interrupting the flow of electricity from battery pack 30. To modulate the production of laser beams by the diode package 16 and to regulate the TEC unit 34, the power supply 14 can include microprocessor controlled electronics as desired. A standby and enable switch 38 is also preferably electrically connected to the battery pack 30 such that the on/off switch 36 is inoperable unless the enable switch 38 is placed in a "standby" position. Thus, the operator must place the laser flashlight 10 into a "standby" mode before it can be turned on.

Figure 10:
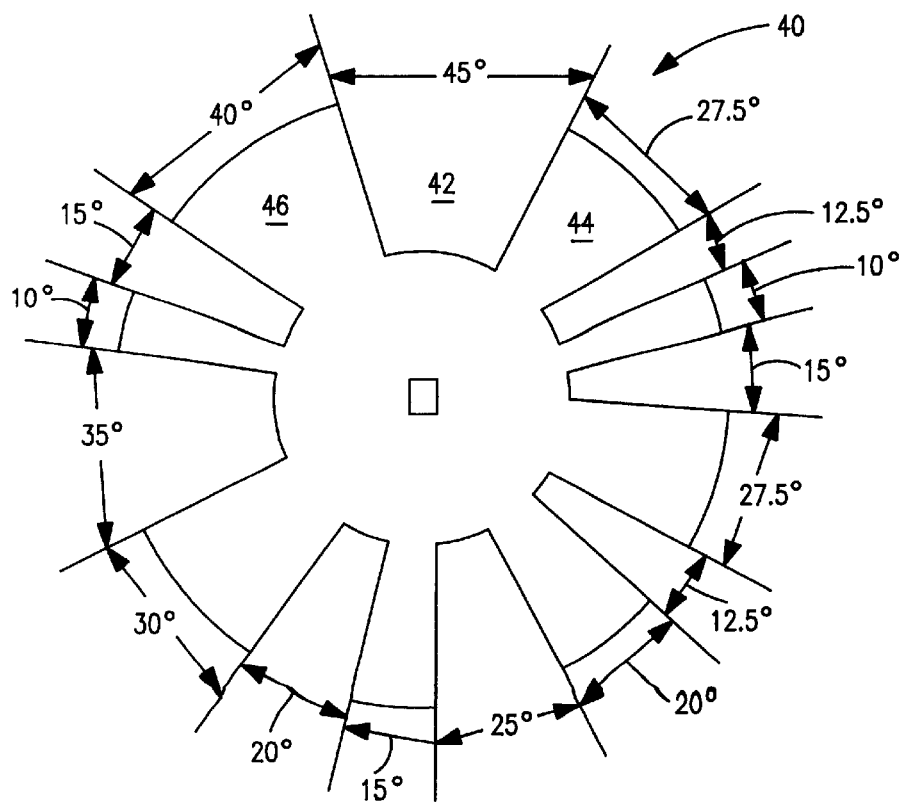
FIG. 10 is a front view of an exemplary pulse wheel which may be electronically incorporated into the present invention.

As noted above, the power supply electronics can be used to either periodically or randomly interrupt the flow of electricity from battery pack 30 to diode package 16. For example, the power supply 14 can include electronics which will periodically pulse electricity from battery pack 30 to diode package 16 at a rate of 20 hertz with a 50% duty cycle to create a strobe-like effect. Naturally, these electronics are also be powered by battery pack 30 and the frequency and duty cycle can be varied as desired. For example, with reference to FIG. 10, the electronics may pulse the diode package at a pulse sequence which is equivalent to a mechanical wheel 40 used to mechanically convert a continuous wave laser beam to a pulsed beam. The wheel 40 may be conceptually envisioned as having notches 42 in the outer perimeter 44 which define a series of radially extending tabs 46. The pulse wheel 40 is positioned such that the outer perimeter 44 of the wheel 40 is in the path of a light beam. It should be appreciated that the light beam is alternately blocked and then allowed to pass as the pulse wheel 40 rotates and the tabs 46 and notches 42 pass through the light beam. In the preferred embodiment, the arc width of tabs 46 and notches 44 are selected to produce an intermittent asymmetric pulse. The pulse wheel 40 shown in FIG. 10 has a 50% duty cycle and produces a 20 cycle flicker at 120 RPM. Experimentation has shown that such a flicker sequence is extremely disorienting to most people.

The diode package 16 is disposed within the cylindrical body along axis A such that laser beams emitted therefrom will be directed towards the aperture 24 of housing 12. Naturally, the power supply 14 and the battery pack 30 are disposed rearwardly of diode package, i.e., towards first end 22 of housing 12, so as not to optically interfere with laser beams produced by the diode package 16. A diode 48 which operates at 808 nanometers (nm) and which produces approximately one to four watts of power is preferably used. Diode package 16 includes a high-heat-load (HHL) package that is moisture sealed and contains TEC unit 34 for adjusting the diode operating temperature and, thus, its wavelength to match the absorption of the laser crystal. However, a variety of other diode packages could be utilized with the present invention. While the diode package 16 is preferably supplied electricity from battery pack 30 on a continuous basis when laser flashlight 10 is in an "on" condition, the diode package 16 could be pulsed at appropriate rates as desired to prolong the operating life of batteries and/or produce pulsating effects as desired.

Laser beams exiting the diode package 16 are focused into the laser crystal of the optical system 50 to excite laser emission from the resonator 18. The beam expander 20 preferably includes a plurality of light transmissive lenses 52, 54, 56, 58 to disperse the laser beam delivered thereto by the resonator 18, whereby laser flashlight 10 emits an eyesafe light dispersion pattern into the ambient environment at the aperture 24. Lenses 54, 56, 58 may be aspheric. Outer lens 52 is a flat element which preferably ensures a tight seal with shell 26 and does not optically distort light passing therethrough. Lenses 54 and 56 are preferably concave-convex to ensure a wide dispersion pattern of light passing therethrough. Additionally, lens 58 is preferably concave, both in the direction of and in the direction opposite to the travel of light therethrough (i.e. double concave) to, once again, maximize light dispersion. As shown in FIG. 1, lenses 52, 54, 56, 58 are axially disposed about axis A. Lenses 52, 54, 56, 58 function as a group to disperse laser beams transmitted from the resonator across the first end to ensure compliance with the Food and Drug Administration CDRH requirements for eye safety. Accordingly, the laser beam emitted from the front surface 60 of lens 52 is eyesafe throughout its extant.

The best guidance in matters pertaining to damage in the human eye from laser sources is provided by the American National Standards Institute (ANSI) laser safety standard ANSI Z136.1-1993. The retinal damage threshold in general depends upon the laser wavelength, the exposure duration, and whether or not the laser is operated in continuous wave or pulsed or modulated mode and, if pulse operated, the repetition rate and the pulse duration. Damage thresholds and maximum permissible exposure (MPE) are usually calculated for a dark-adapted or a fully dilated eye whose pupil is 7 mm in diameter. Lasers of the type used in the subject invention are continuos wave or modulated. To assess the eye-safety issue for these lasers, it is necessary to calculate the intensity (W or mW/cm$^2$) at the location of the eye and the exposure duration.

Figure 2:
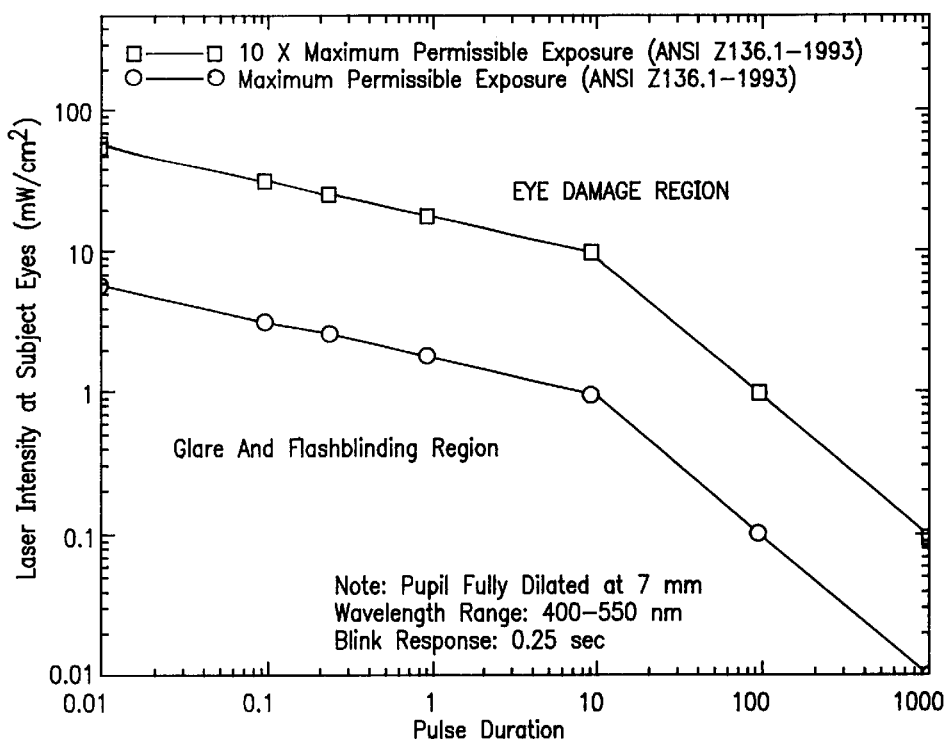
FIG. 2 is a chart illustrating the laser intensity at the eyes of a subject as a function of pulse duration required to achieve either the glare and flashblinding region or the eye damage region in accordance with an accepted laser safety standard.

FIG. 2 shows the MPE and ten times the MPE, for the range of blue and green wavelengths (400–550 nm) as a function of pulse or exposure duration according to ANSI Z136.1-193. It can be seen that the damage threshold decreases as exposure duration increases. The glare region occurs below the ANSI standard curve whereas flashblinding or dazzling occurs in the upper region near the ANSI curve and between the ANSI curve and the 10 times or damage threshold curve. For a 10 msec (0.01) second exposure, approximately the minimum needed to produce glare or flashblinding, the damage threshold is approximately 56.9 mW/cm$^2$ (0.0569 W/cm$^2$). For a 0.25 sec exposure, which characterizes the typical blink response in humans, the damage threshold is approximately 26.0 mW/cm$^2$. The ANSI standard for these two cases gives 5.69 and 2.60 mW/cm$^2$, respectively.

The laser flashlight 10 can be used to induce a number of aversion responses in subjects or individuals that can provide a substantial advantage to the user. One aversion response is for the subject to immediately turn away from the source of the bright light. This is a substantial advantage for the user, especially in dealing with armed or dangerous individuals. Another response is for the subject to delay any further action or to hesitate, providing the user with time to assess the appropriate responses. One cause of the delay is because a subject wants to see the source of the bright light but cannot see around the bright beam. In effect an illuminated individual sees an "optical wall" of light, thus protecting the user. Some illuminated individuals experience dizziness or vertigo. This is especially true when the laser flashlight is modulated at a random or asymmetric rate.

The laser flashlight 10 may be used for crime-scene investigation, particularly in connection with identifying the location of fingerprints. The green laser flashlight operating near 532 nm is particularly useful since it can be used to cause various Rhodamine or other dyes to fluoresce in the visible region. Such dyes are routinely used in fingerprint dusting powders. The blue region of the spectrum can also be used to excite other dyes of interest. A green laser flashlight is more effective in providing illumination in a smoke filled environment than an ordinary flashlight. A laser flashlight 10 operating in the green region near 532 nm is very effective in underwater applications since it is near the peak transmission of water, allowing a larger penetration depth than a common flashlight.

Figure 4:
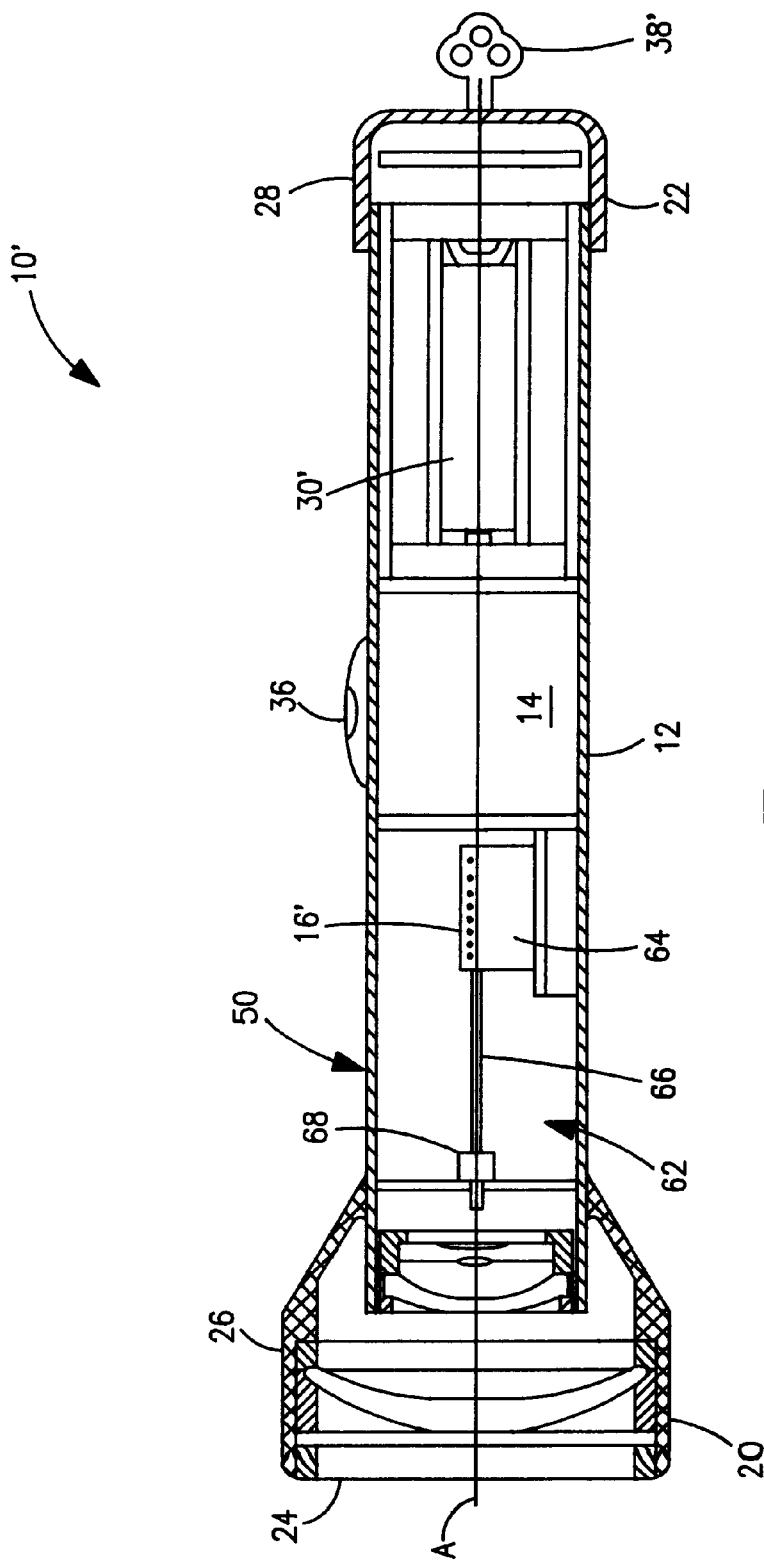
FIG. 4 is a cross-sectional elevation view of another preferred embodiment of the laser flashlight of the present invention.

An alternative preferred embodiment of the laser flashlight of the instant invention is depicted in FIG. 4. As shown therein, laser flashlight 10' includes a battery pack 30', a power supply 14, a beam expander 20, an optical system 50' including an optical fiber assembly 62 and a diode package 16'. The primary difference between laser flashlight 10' and laser flashlight 10 is that laser flashlight 10' utilizes a diode laser 64 which is directly coupled to beam expander 20 via optical fiber assembly 62 to generate laser beams rather than the diode-pumped solid-state laser of the FIG. 1 embodiment. The optical fiber assembly 62 includes an optic fiber 66 and a fiber optic connector 68. Diode lasers 64 of this nature are becoming increasingly available in higher and higher power ratings for various wavelengths, including the green range.

Since the output of a diode laser 64 can be converted to other wavelengths via many of the non-linear resonators described below, the laser flashlight 10' could, optionally, be equipped with a suitable resonator depending on the diode laser 64 selected. However, this laser flashlight configuration is preferred due to its simplicity and its power, weight and size minimization capabilities. Diode lasers 64 of comparable power and frequency ratings to those discussed above are preferred for use with this embodiment. Finally, since there is no need to cool optical fiber 66 (i.e., there is preferably no resonator to cool in this embodiment), battery pack 30' can be modified to utilize still fewer batteries.

The various components of the laser flashlights 10, 10' are, as shown, sized, shaped and oriented such that laser flashlight 10, 10' generally mimics the size, shape, weight and function of a "standard issue" incandescent flashlight used by law enforcement personnel. Accordingly, the handheld laser flashlight 10, 10' of the instant invention can be used as a non-lethal weapon in the manner that "standard issue" incandescent flashlights are so used. Laser flashlights 10, 10' can also be configured in a sealed water-tight manner so that it can be operated under water and in inclement weather.

Figure 3:
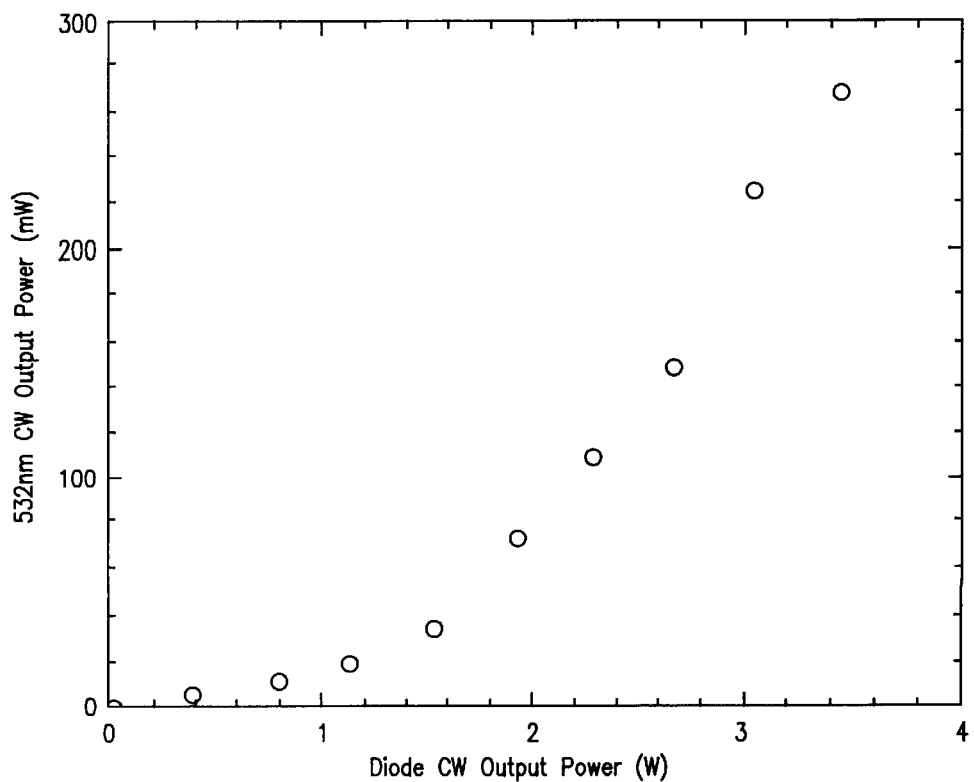
FIG. 3 is a chart illustrating the output power of the laser flashlight of FIG. 1 as a function of diode output power.
Figure 5:
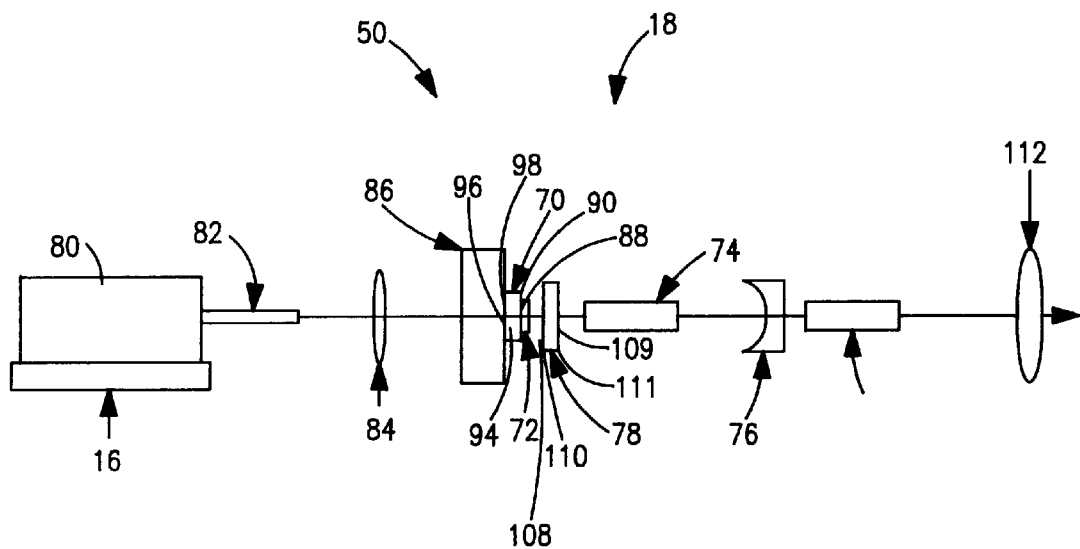
FIG. 5 is a schematic representation of a first embodiment of a green light solid state laser and diode for use with the present invention.

With reference to FIG. 5, the optical system 50 preferably includes a sapphire crystal window 70 to dissipate heat, a laser crystal 72, and a harmonic generating crystal 74 for shifting the fundamental lasing wavelength of the resonator 18. In the embodiment shown in FIG. 5, the resonator 18 first shifts the wavelength of the laser beam from 880 nm to an intermediate wavelength of 1064 nm. A second harmonic generating crystal 74 shifts the wavelength of the laser beam from the fundamental intermediate wavelength of 1064 nm to 532 nm (green light). To completely utilize the green light, the green light traveling backwards toward the laser crystal 72 must be turned around and made to co-propagate with the green light traveling toward the outcoupler 76. A "green trapping mirror" or harmonic high reflector 78 may be disposed between the laser crystal 72 and the harmonic generating crystal 74. FIG. 3 illustrates the output power attainable by the laser flashlight 10 of FIG. 1 as a function of diode output power.

Other non-linear schemes can also be used such as tripling, quadrupling sum-frequency generation, parametric oscillation, Raman conversion, etc., to produce a wide variety of different wavelengths useful for different purposes. Additionally, laser materials capable of operating at different wavelengths can be utilized to provide the further flexibility of operation at the various transition points offered thereby. For example, Nd:Vanadate or Nd:YAG laser crystals have additional transitions located in the vicinity of 920 nm and 1350 nm. Long term fluctuations in output power can be minimized by utilizing a TEC on the non-linear crystal.

FIG. 5 illustrates a first embodiment of a green light solid state laser and diode 80 for use in laser flashlight 10. An optical fiber 82 is mated or pigtailed to the diode 80. Typically the optical fiber 82 will be only a few centimeters long. The diode 80 can emit up to 4 watts of continuous wave pump power near 808 nm, for example. The optical fiber 82, which typically can have 90% transmission, is usually a clad multimode silica fiber with a core diameter between 100–600 $\mu$m and a numerical aperture (NA) of 0.22. For higher power versions of the flashlight 10, the single diode 80 can be replaced by an array or a bar of laser diodes, thereby providing fiber output powers of up to 20 watts or more continuous wave.

A single lens 84 may be used to collect the diode light and image it with unity magnification into the Nd:YVO$_4$ (vanadate) laser crystal 72, thereby providing an excitation spot having a diameter which is essentially equal to the fiber core diameter. Alternatively, one or more lenses may be used to produce a spot diameter in the vanadate laser crystal 72 which is smaller than the fiber core diameter. The smallest spot size that can be achieved is determined by the beam-quality of the diode light emerging from the fiber 82, which is typically multi-mode and far from the diffraction-limit. Excitation spots having spot diameters between about 50 and 600 $\mu$m are easily produced, depending on the diode source 16 and the focusing system 84. The smallest spot sizes produce the highest laser efficiency.

The vanadate laser crystal 72 may be only 1–2 mm thick and have a Nd doping that is large enough to absorb most or all of the diode light. The vanadate laser crystal 72 is arranged to be in intimate contact with a sapphire window 70 whose purpose is to draw the heat out of the vanadate and transfer it to the heat sink 86 which is preferably oxygen-free Cu. The thermal conductivity of vanadate is very low (0.05 W/cm-K) while that of sapphire is 5.6 times greater (0.280 W/cm-K). Because sapphire is a clear optical material the vanadate laser crystal 72 is optically-pumped through the sapphire crystal 70. The predominant thermal gradients with this arrangement are in the longitudinal or axial direction or the optical axis A of the laser. Consequently, the thermal gradients do not affect beam-propagation and the laser is insensitive to thermal effects over a wide range of input powers. The face-cooled laser is described in greater detail in U.S. patent application Ser. No. 08/857,700, filed May 16, 1997 and U.S. patent application Ser. No. 09/093,508 filed Jun. 8, 1997, which are hereby incorporated by reference.

The front face 90 (facing outcoupler 76) and the rear face 96 of sapphire crystal 70 are each coated 88, 98 with an anti-reflective (AR) material around 808 nm to eliminate reflective losses of resonator light. The rear face 92 of the vanadate laser crystal 72 is coated 94 with a material that is highly-transmissive (HT) at the diode wavelength but which is also a highly-reflective (HR) at the laser transition of interest and the harmonic wavelength. In a first example, coating 94 may be highly-reflective at 1064 nm and 532 nm. In a second example, coating 94 may be highly-reflective at 945 nm and 473 nm.

The outcoupler 76 may have two variations. The first variation is preferred when it is desirable to have the laser operate at a fundamental laser transition, in which case the curved, rear face 100 of the outcoupler 76 is coated 102 with a partially-reflective (PR) material at the laser wavelength. The second variation is preferred when it is desirable to use an intra-cavity nonlinear crystal like that shown in FIG. 5 to frequency double the fundamental laser transition into the visible region. In that case the curved, rear face 100 of the outcoupler 76 is coated 102 with a material which is HR at the fundamental wavelength and HT at the frequency doubled wavelength. The front, output face 104 of the outcoupler 76 is coated 106 with a material which is AR at either the fundamental or the second-harmonic wavelength, depending upon whether the first or second variation is used.

The outcoupler substrate material is typically fused silica but can also be any other transmissive optical material such as glass, sapphire, or other. The nonlinear harmonic generation crystal 74 is placed inside the resonator 18 to convert the laser light from a fundamental frequency and wavelength to a harmonic frequency and wavelength. In a preferred embodiment, the harmonic generation crystal 74 is a second harmonic generation crystal for converting a fundamental wavelength of 1064 nm to a harmonic wavelength of 532 nm. The conversion efficiency is highest for intra-cavity operation since the fundamental intensity inside the resonator 18 is many times higher than what could be obtained by operating the laser at the fundamental wavelength and then focusing the output into an external nonlinear crystal. The conversion efficiency from the fundamental to the second-harmonic is critically dependent upon the intensity of the fundamental beam.

A harmonic high reflector 78 or mirror, for example a second-harmonic reflector, may be positioned between the laser crystal 72 and the harmonic generation crystal 74 to increase the efficiency of the flashlight 10. The rear face 108 (facing the diode) of the mirror 78 is coated 110 with a material which is AR at the fundamental wavelength. The front face 109 of the mirror 78 is coated 111 with a material which is AR at the fundamental wavelength and HR at the second-harmonic wavelength. When employed, the mirror 78 collects most of the backwards traveling second-harmonic light and transmits it coincident with the forward traveling light, thus increasing the conversion efficiency and overall laser efficiency.

The fundamental or harmonic beam emerging from the laser resonator 18 is very intense and usually not eye-safe. To make the laser eye-safe, a beam expander 20 functions as an optical group to first increase the beam diameter and then collimate it or produce a beam diverging from the objective lens 112 at a desired divergence. The diameter of the laser beam impinging the input surface of the expander is less than the diameter of the laser beam at the exit surface of the beam expander. Because the beam is always collimated or diverging after the objective lens 112, it is always eye-safe after the front surface 60 of lens 52 and any distance beyond. This is one of the key design features. The lenses 112 and 114 or 52, 54, 56, 58 of FIG. 1 used for the beam expander can consist of two or more of conventional or non-conventional design and may be spherical or aspherical. In one preferred embodiment, a gradient index (GRIN) or an aspheric lens 114 is used to rapidly expand the beam. Collimation is then achieved by using the objective lens 112. Since the GRIN or aspheric lens 114 can be designed to have a large NA, the distance between that lens 114 and the objective lens 112 is minimized, allowing the laser flashlight 10 to be of minimal length. The use of conventional spherical lenses would result in a much longer beam expander.

The resonator 18 is a hemispherical type, defined by the flat rear surface 92 of the vanadate laser crystal 72 and the curved rear face 100/104 of the outcoupler 76. An optimal design provides an output beam that is a Gaussian or fundamental $TEM_{00}$ mode. This may be achieved by choosing the resonator spacing and outcoupler curvature so that the minimum waist or spot diameter, located at the rear face 92 of the vanadate laser crystal 72, is approximately matched to the excitation spot diameter of the diode light. The beam diameter inside the resonator 18 is minimum at the rear surface 92 of the laser crystal 72. Consequently, the nonlinear harmonic generation crystal 74 is placed as close as possible to the laser crystal 72 so that the fundamental intensity is maximized. In practice, it has been found that short resonators in the range of 1–3 cm and outcoupler curvatures in the range of 5–15 cm are optimum for maximizing the laser efficiency and producing a diffraction-limited fundamental output beam.

It should be appreciated that other extensions of this technology can be made, for example to incorporate intra-cavity third or fourth harmonic generation or an intra-cavity optical parametric oscillator. It is also possible to include dispersive elements for tuning the output of tunable solid-state laser materials to different output wavelengths. Lasers of the type shown in FIG. 5 may be operated at more than one wavelength simultaneously.

Figure 6:
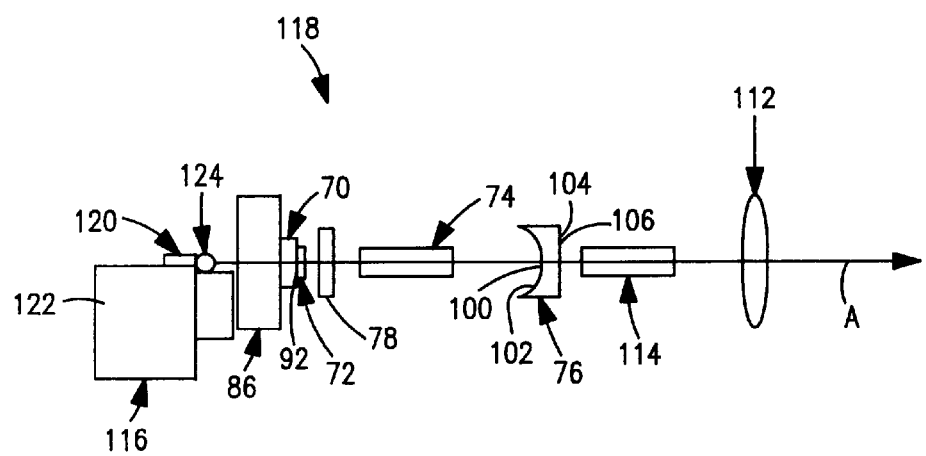
FIG. 6 is a schematic representation of a second embodiment of a green light solid state laser and diode for use with the present invention.

The embodiment illustrated in FIG. 6 is similar to that shown in FIG. 5 except that the diode source 116 and optical system 118 for delivering the diode light have been modified to eliminate the need for the focusing lens(es) 84 of FIG. 5, thereby shortening the device. Laser diodes have a very astigmatic output pattern and diverge rapidly (typically 35–45° full-width at half-maximum (FWHM)) perpendicular to the thin diode stripe on the diode output (front) face and more slowly in the direction parallel to the stripe (typically 8–12° FWHM). The diode stripe is typically 1 $\mu$m thick and 50–300 $\mu$m wide for a multimode device. In the embodiment of FIG. 6, a laser diode 120 mounted on a heat sink 122 has a collimating lens 124 attached to it close to the diode output face. The lens 124 may be collimating in both parallel and perpendicular directions and can produce an output beam that is collimated or with nearly equal divergence in both directions. For the design shown in FIG. 6 the diode light is collimated in both directions and the diode output beam profile is typically close to a square. The diode assembly 116 and collimating lens 124 are placed as close as possible to the vanadate laser crystal 72. By eliminating focusing optics the configuration shown in FIG. 6 is more compact than that of FIG. 5. In addition lens losses are eliminated. This increase in efficiency is somewhat mitigated however by some of the diode excitation being lost since the extracting beam is round, not square.

Figure 7:
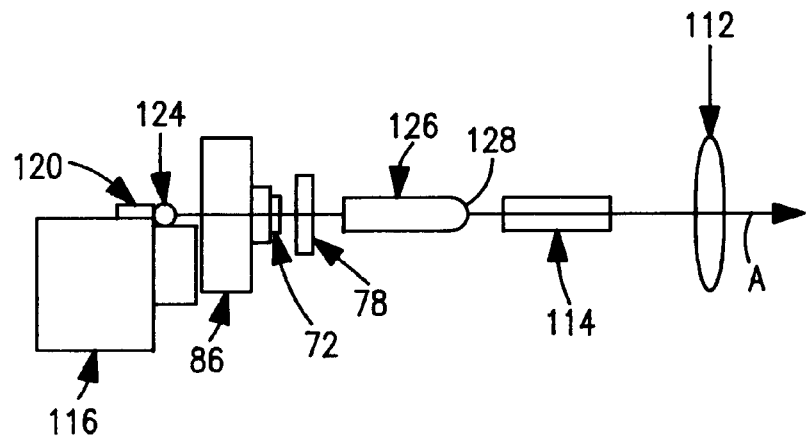
FIG. 7 is a schematic representation of a third embodiment of a green light solid state laser and diode for use with the present invention.

In the embodiment shown in FIG. 7, the outcoupler of FIG. 6 has been eliminated by placing the curvature required to make the resonator stable and mode match the internal mode to the diode spot diameter, on the nonlinear harmonic generation crystal 126. As shown in FIG. 7, the front face 128 of the nonlinear harmonic generation crystal 126 has a convex-shape to provide the proper curvature. The harmonic high reflector 78 can also be eliminated in the embodiments shown in FIGS. 5–7 by placing a coating 94, which is HR for both the fundamental and harmonic wavelengths, directly on the rear face 92 of the laser crystal 72. This configuration is the simplest and occupies the least amount of linear distance of any of the embodiments discussed thus far.

Figure 8:
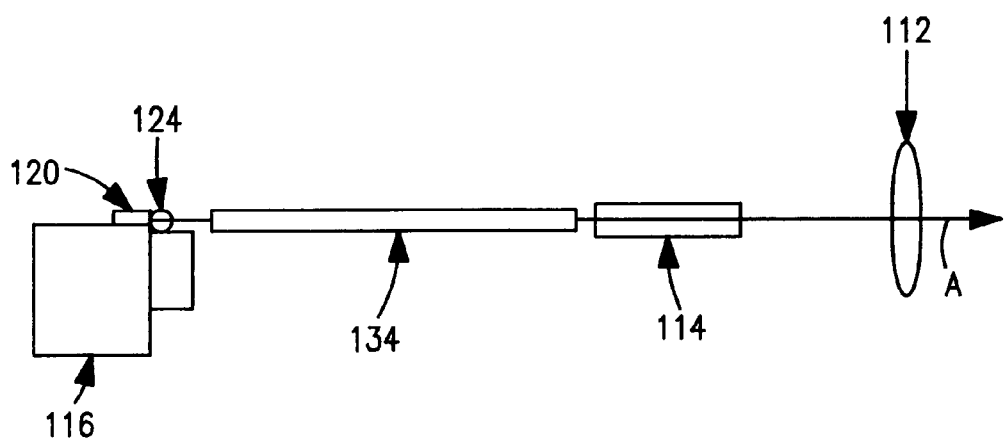
FIG. 8 is a schematic representation of a fourth embodiment of a green light solid state laser and diode for use with the present invention.

FIG. 8 illustrates a fourth embodiment of a green light solid state laser and diode for use in laser flashlight 10 in which the solid-state laser resonator has been eliminated altogether. The output of the diode 120 is collimated by passage through a collimating lens 124. The astigmatic nature of the laser light is eliminated by letting the collimated output propagate through a length of multimode optical fiber 134 where the output is completely homogenized and circular due to the mixing and excitation of numerous propagation modes in the fiber 134. If the numerical aperture of the fiber 134 is large enough the diode light is simply allowed to diverge where it is collimated and made eye-safe using an objective lens 112. If the numerical aperture is not large enough, however, a GRIN or other lens 114 can be inserted to increase the divergence. The optical fiber 134 may also be eliminated if output homogeneity is not that important. The objective lens 112 then will also act as an aperture and produce a circular output beam at the expense of laser efficiency since part of the square output beam from the collimating lens 124 will be lost.

Figure 9:
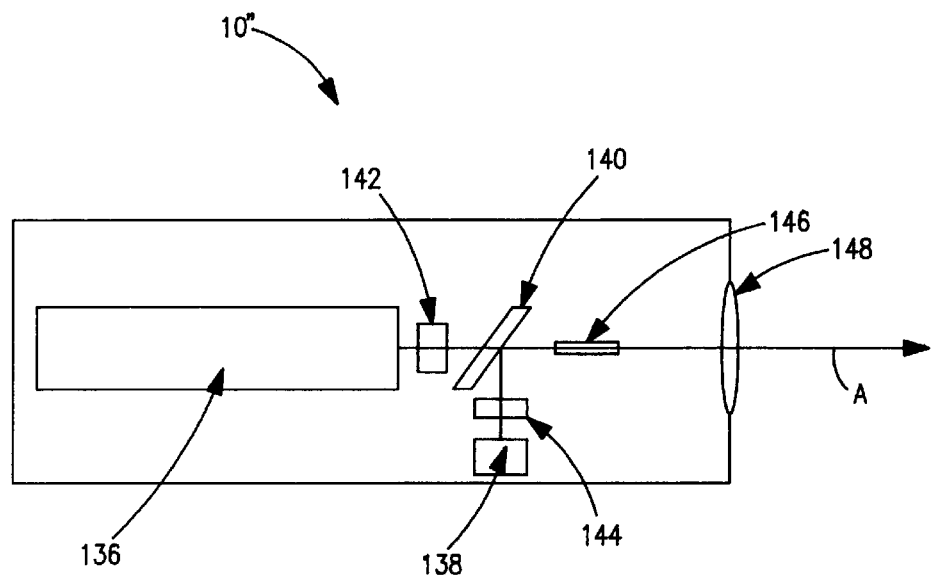
FIG. 9 is a schematic representation of dual-color laser and diodes for use with the present invention.

An alternative to using the diode package as described above is to utilize a plurality of diode packages of either the same or different frequencies. This alternative provides for the possibility of producing laser beams of multiple frequencies simultaneously. With reference to FIG. 9, a flashlight 10" in accordance with the invention may produce a dual wavelength laser output in the visible region. A frequency-doubled, green 532 nm $Nd:YVO_4$ laser 136 is combined with a red diode laser 138 operating in the 630–670 nm spectral range. An integrated power supply 14 may provide excitation to either laser separately or at the same time. Combining the output from both lasers 136, 138 is achieved with a polarizer 140. Preferably, polarizer 140 transmits all of the green 532 nm light for "s" polarization (in the plane of the Figure) and reflects all of the red 630–670 nm light which has "p" polarization (perpendicular to the plane of the Figure). Alternatively, polarizer 140 may transmit all of the green 532 nm light for "p" polarization and reflect all of the red 630–670 nm light which has "s" polarization. Beam forming optics 142, 144, which comprise various reflective or refractive optics, are used to manipulate the output of both lasers 136, 138, providing the proper beam shape, size and divergence so that both may be arranged to enter the first beam expander lens 146. The first and second beam expander lenses 146, 148 expand both the coincident and parallel beams and transmit a laser beam from the enclosure. The design of the flashlight 10" must take into account the effect of the different refractive power of optical elements such as lenses 142, 144 for the two different wavelengths of laser light.

In embodiments employing a plurality of diode-pumped lasers, the various diodes may be operated in a continuous wave mode and/or in a modulated mode, i.e., the diodes could be operated in either continuous wave or modulated modes independently of one another. As yet another alternative, a diode package can be operated to generate laser beams at a plurality of wavelengths.

While the present invention has been described in connection with what is presently considered to be the most practical and preferred embodiments, it is understood that the invention is not limited to the disclosed embodiments.

What is claimed is:

1. A hand-held laser flashlight for emitting an eyesafe light dispersion pattern into an ambient environment comprising:

a housing having first and second ends;

a first laser emitter disposed within the housing for emitting a first coherent light beam toward the first end of the housing along an optical axis;

a power controller powered by at least one battery for selectively applying an electrical input to the first laser emitter;

an optical system disposed within the housing along the optical axis intermediate the first laser emitter and the first end of the housing and responsive to the coherent light beam for generating a laser beam for projection along the optical axis, the optical system including a resonator having an optical element comprising an optically transmissive material for propagating laser energy along the optical axis and a converter, the optical element receiving the first coherent light beam emitted by the diode and emitting a first laser beam having a first wavelength, the converter receiving the first laser beam from the optical element, converting the first wavelength to a second wavelength, respectively, and emitting a second laser beam having the second wavelength toward the first end of the housing, the optical element having a substantially flat end surface facing the first laser emitter, the converter having a convex end surface facing the first end of the housing, the end surface of the optical element and the convex end surface of the converter defining the resonator; and a light transmissive beam expander disposed at the first end of the housing along the optical axis, the beam expander having oppositely disposed input and output optical surfaces, the laser beam impinging the input surface at a first beam diameter and exiting the exit surface at a second beam diameter, the laser beam exiting the exit surface having an intensity which may not be greater than 26 mW/cm$^2$.

2. The laser flashlight of claim 1 wherein the first laser emitter includes a diode and the optical system includes an optical element comprising an optically transmissive material for propagating laser energy along the optical axis and a converter, the optical element receiving the first coherent light beam emitted by the diode and emitting a first laser beam having a first wavelength, the converter receiving the first laser beam from the optical element, converting the first wavelength to a second wavelength, respectively, and emitting a second laser beam having the second wavelength to the beam expander.

3. The laser flashlight of claim 2 wherein the converter includes a resonator comprising a harmonic generating crystal, the resonator shifting the first wavelength of the first laser beam to an intermediate wave length and the harmonic generating crystal shifting the intermediate wave length to the second wavelength of the second laser beam.

4. The laser flashlight of claim 3 wherein the harmonic generating crystal is a second harmonic generating crystal, the first wavelength is substantially equal to 808 nm, the intermediate wave length is substantially equal to 1064 nm, and the second wavelength is substantially equal to 532 nm.

5. The laser flashlight of claim 3 wherein the harmonic generating crystal is a second harmonic generating crystal, the first wavelength is substantially equal to 808 nm, the intermediate wave length is substantially equal to 945 nm, and the second wavelength is substantially equal to 473 nm.

6. The laser flashlight of claim 3 wherein the optical system further includes an optically transmissive heat conductive element having a thermal conductivity greater than or equal to that of the optical element and a heat sink, the heat sink being in thermal contact with the optical element via the heat conductive element.

7. The laser flashlight of claim 6 wherein the heat conductive element has opposed first and second axially spaced end surfaces, the second end surface of the heat conductive element being adjacent to the optical element, the first and second end surfaces being coated with a material that is anti-reflective at the first wavelength.

8. The laser flashlight of claim 7 wherein the optical element has opposed first and second axially spaced end surfaces, the first end surface of the optical element being adjacent to the second surface of the heat conductive element, the first end surface of the optical element being coated with a material that is highly transmissive at the first wavelength and highly-reflective at the intermediate and second wavelengths.

9. The laser flashlight of claim 3 wherein the optical system further includes an outcoupler disposed intermediate the converter and the beam expander, the outcoupler having opposed first and second axially spaced end surfaces, the first end surface of the outcoupler being disposed adjacent the converter and having a concave shape.

10. The laser flashlight of claim 9 wherein the first end surface of the outcoupler is coated with a material which is highly-reflective at the intermediate wavelength and highly-transmissive at the second wavelength.

11. The laser flashlight of claim 9 wherein the first end surface of the outcoupler is coated with a material which is partially-reflective at the intermediate wavelength.

12. The laser flashlight of claim 3 wherein the optical system further comprises an optically transmissive harmonic mirror element axially disposed intermediate the optical element and the harmonic generating crystal, the harmonic mirror having opposed first and second axially spaced end surfaces, the second end surface of the harmonic mirror facing the harmonic generating crystal and being coated with a material that is highly-transmissive at the intermediate wavelength and highly-reflective at the second wavelength.

13. The laser flashlight of claim 3 wherein the harmonic generating crystal has an end surface facing the optical element, the end surface of the harmonic generating crystal being coated with material which is highly-transmissive at the intermediate wavelength and highly-reflective at the second wavelength.

14. The laser flashlight of claim 3 wherein the harmonic generating crystal has a substantially flat first end surface and a convex-shaped second end surface, the first end surface facing the optical element.

15. The laser flashlight of claim 2 wherein the optical system further includes at least one lens disposed intermediate the first laser emitter and the optical element.

16. The laser flashlight of claim 2 wherein the beam expander comprises at least one collimating lens disposed on the optical axis and the optical system further includes a gradient index or ashperic lens disposed on the optical axis intermediate the converter and the collimating lens.

17. The laser flashlight of claim 1 wherein the first laser emitter comprises a diode and an optical fiber having a first end for receiving the first coherent light beam emitted by the diode and a second end for transmitting the first coherent light beam to the optical system.

18. The laser flashlight of claim 1 wherein the first laser emitter comprises a diode and a collimating lens for receiving, collimating and transmitting the first coherent light beam emitted by the diode to the optical system.

19. The laser flashlight of claim 18 wherein the optical system comprises an optical fiber disposed coaxially with the optical axis, the optical fiber having a first end for receiving the first coherent light beam emitted by the collimating lens and a second end for transmitting the laser beam to the beam expander.

20. The laser flashlight of claim 19 wherein the optical system further comprises a gradient index or aspheric lens disposed on the optical axis intermediate the second end of the optical fiber and the beam expander.

21. The laser flashlight of claim 1 further comprising means for pulsing the second laser beam.

22. The laser flashlight of claim 21 wherein the means for pulsing the second laser beam selectively interrupts the second laser beam to produce intermittent asymmetric laser beam pulses.

23. A laser flashlight for emitting a light dispersion pattern into an ambient environment comprising:
  a housing having a light emitting end;
  a laser emitter disposed within the housing, the laser emitter emitting a coherent light toward the light emitting end of the housing along an optical axis upon the application of electricity;
  a power supply for selectively applying electricity to the laser emitter;
  an optical system disposed within the housing, along the optical axis, intermediate the laser emitter and the light emitting end of the housing, the optical system including a laser element pumped by the laser emitter, a converter, and a resonator, the laser element receiving the coherent light emitted by the laser emitter and emitting a first laser beam having a first wavelength, the resonator shifting the first laser beam to an intermediate laser beam having an intermediate wave length, the converter receiving the intermediate laser beam and converting the intermediate laser beam to a second laser beam having a second wavelength and emitting the second laser beam along the optical axis, the optical system further comprising an optically transmissive mirror element axially disposed intermediate the laser element and the converter, the mirror element being highly-transmissive at the intermediate wavelength and highly-reflective at the second wavelength; and
  a light transmissive beam expander disposed at the light emitting end of the housing and along the optical axis, the beam expander receiving and dispersing the second laser beam, wherein the second laser beam has an intensity not greater than 26 mW/cm$^2$.

24. The laser flashlight of claim 23 wherein the converter comprises a second harmonic generating crystal, the first wavelength is substantially equal to 808 nm, the intermediate wave length is substantially equal to 1064 nm, and the second wavelength is substantially equal to 532 nm.

25. The laser flashlight of claim 23 wherein the optical system further includes an optically transmissive heat conductive element having a thermal conductivity greater than or equal to that of the laser element and a heat sink, the heat sink being in thermal contact with the laser element via the heat conductive element.

26. A hand-held laser flashlight for emitting an eyesafe light dispersion pattern into an ambient environment comprising:
  a housing having first and second ends;
  a first laser emitter disposed within the housing for emitting a first coherent light beam toward the first end of the housing along an optical axis;
  a second laser emitter emitting a second coherent light beam along a light path;
  a power controller powered by at least one battery for selectively applying an electrical input to the first and second laser emitter;
  an optical system including a polarizer disposed within the housing in the light path and along the optical axis intermediate the first laser emitter and the first end of the housing and responsive to the first and second coherent light beams for generating a laser beam for projection along the optical axis; and
  a light transmissive beam expander disposed at the first end of the housing along the optical axis, the beam expander having oppositely disposed input and output optical surfaces, the laser beam impinging the input surface at a first beam diameter and exiting the exit surface at a second beam diameter, the laser beam exiting the exit surface having an intensity which may not be greater than 26 mW/cm$^2$.

27. The laser flashlight of claim 26 wherein the optical system further comprises first and second beam forming optics disposed intermediate the first and second laser emitters and the polarizer.

28. The laser flashlight of claim 26 wherein the optical system further comprises a beam expander lens disposed on the optical axis intermediate the polarizer and the beam expander.

29. The laser flashlight of claim 26 wherein the first and second coherent light beams each have a wavelength, the wavelength of the second coherent light beam being different from the wavelength of the first coherent light beam.

30. The laser flashlight of claim 29 wherein the first laser emitter comprises a diode-pumped, frequency doubled Nd:YVO$_4$ laser and the second laser emitter comprises a red diode laser.

31. The laser flashlight of claim 26 wherein the laser beam transmitted by the polarizer is composed of a portion of the first coherent light beam having an s-polarization and a portion of the second coherent light beam having a p-polarization.

32. The laser flashlight of claim 26 wherein the laser beam transmitted by the polarizer is composed of a portion of the first coherent light beam having a p-polarization and a portion of the second coherent light beam having an s-polarization.

33. The laser flashlight of claim 26 wherein the first laser emitter is a diode laser, the optical system comprises an optical fiber disposed on the optical axis having a first end for receiving the first coherent light beam emitted by the first laser emitter and a second end for transmitting the laser beam to the beam expander.

* * * * *